US005597792A

United States Patent [19]
Klier et al.

[11] Patent Number: 5,597,792
[45] Date of Patent: Jan. 28, 1997

[54] HIGH WATER CONTENT, LOW VISCOSITY, OIL CONTINUOUS MICROEMULSIONS AND EMULSIONS, AND THEIR USE IN CLEANING APPLICATIONS

[75] Inventors: John Klier, Midland; Gary M. Strandburg, Mount Pleasant; Christopher J. Tucker, Bay City, all of Mich.

[73] Assignee: The Dow Chemical Company, Midland, Mich.

[21] Appl. No.: 288,419

[22] Filed: Aug. 10, 1994

Related U.S. Application Data

[63] Continuation-in-part of Ser. No. 42,366, Apr. 2, 1993, abandoned.

[51] Int. Cl.$^6$ ............................. C11D 17/00; C11D 3/43; C11D 3/60; C23G 5/06
[52] U.S. Cl. ..................... 510/417; 252/309; 510/245; 510/254; 510/256; 510/273; 510/274; 510/432; 510/433; 510/495; 510/497; 510/499; 510/505; 510/506
[58] Field of Search ..................... 252/170, 171, 252/DIG. 14, 174, 173, 309, 558, 539, 547, 528

[56] References Cited

U.S. PATENT DOCUMENTS

| | | | |
|---|---|---|---|
| Re. 33,210 | 5/1990 | Stoufer | 252/153 |
| 2,073,464 | 3/1937 | Davey | 252/122 |
| 2,948,686 | 8/1960 | Giandladis | 252/153 |
| 3,254,714 | 6/1966 | Gogarty et al. | 166/274 |
| 3,277,013 | 10/1966 | Gianladis | 252/153 |
| 3,382,285 | 5/1968 | Egan et al. | 568/625 |
| 3,482,632 | 12/1969 | Holm | 166/273 |
| 3,500,918 | 3/1970 | Holm | 166/273 |
| 3,500,919 | 3/1970 | Holm | 166/273 |
| 3,504,041 | 3/1970 | Welpert | 568/625 |
| 3,507,798 | 4/1970 | Egan et al. | 252/135 |
| 3,625,909 | 12/1971 | Dusseldorf et al. | 252/153 |
| 3,637,022 | 1/1972 | Kelly et al. | 169/44 |
| 3,673,124 | 6/1972 | Holm | 507/259 |
| 3,691,072 | 9/1972 | Holm | 507/259 |
| 3,697,424 | 10/1972 | Holm | 507/259 |
| 3,707,506 | 12/1972 | Lozo | 252/139 |
| 3,741,902 | 6/1973 | Barrett, Jr. | 252/90 |
| 3,753,904 | 8/1973 | Holm | 507/259 |
| 3,764,544 | 10/1973 | Haworth | 252/89 |
| 3,769,209 | 10/1973 | Holm | 507/259 |
| 3,872,021 | 3/1975 | McKnight | 252/121 |
| 4,012,329 | 3/1977 | Hayes et al. | 507/135 |
| 4,022,699 | 5/1977 | Holm | 252/8.55 D |
| 4,180,472 | 12/1979 | Mitchell et al. | 252/162 |
| 4,414,128 | 11/1983 | Goffinet | 252/111 |
| 4,438,009 | 3/1984 | Brusky et al. | 252/90 |
| 4,540,448 | 9/1985 | Gautier et al. | 148/6.15 |
| 4,540,505 | 9/1985 | Frazier et al. | 252/106 |
| 4,561,991 | 12/1985 | Herbots et al. | 252/118 |
| 4,606,840 | 8/1986 | Gautier et al. | 252/171 |
| 4,704,225 | 11/1987 | Stoufer | 252/153 |
| 4,888,119 | 12/1989 | Klewsaat | 252/8.75 |
| 4,909,962 | 3/1990 | Clark | 252/547 |
| 4,919,839 | 4/1990 | Durbut et al. | 252/153 |
| 4,931,201 | 6/1990 | Julemont | 252/91 |
| 4,983,224 | 1/1991 | Mombrun et al. | 134/40 |
| 4,990,269 | 2/1991 | Andreasson et al. | 252/8.554 |
| 5,075,026 | 12/1991 | Loth et al. | 252/122 |
| 5,076,954 | 12/1991 | Loth et al. | 252/122 |
| 5,080,822 | 1/1992 | VanEenam | 252/170 |
| 5,080,831 | 1/1992 | VanEenam | 252/558 |
| 5,082,584 | 1/1992 | Loth et al. | 252/122 |
| 5,108,643 | 4/1992 | Loth et al. | 252/174 |
| 5,158,710 | 10/1992 | VanEenam | 252/539 |
| 5,171,475 | 12/1992 | Friesleben | 252/312 |

FOREIGN PATENT DOCUMENTS

| | | |
|---|---|---|
| 0137615 | 4/1985 | European Pat. Off. . |
| 0160762 | 11/1985 | European Pat. Off. . |
| 2144763 | 3/1985 | United Kingdom . |
| 2190681 | 11/1987 | United Kingdom . |
| 9306204 | 4/1993 | WIPO . |

*Primary Examiner*—Ardith Hertizog
*Attorney, Agent, or Firm*—R. M. O'Keefe; J. T. Hoppe

[57] ABSTRACT

Superior high water containing oil continuous microemulsions and emulsions for cleaning contain defined amounts of water, one or more ionic surfactants, and one or more organic solvents so that the compositions have a low conductivity and low viscosity.

25 Claims, No Drawings

5,597,792

HIGH WATER CONTENT, LOW VISCOSITY, OIL CONTINUOUS MICROEMULSIONS AND EMULSIONS, AND THEIR USE IN CLEANING APPLICATIONS

CROSS-REFERENCE TO RELATED APPLICATION

This application is a continuation-in-part of application Ser No. 08/042,366, filed Apr. 2, 1993, now abandoned.

BACKGROUND OF THE INVENTION

This invention concerns microemulsions and emulsions, and their use in various applications.

Microemulsions are well known. Typical components of microemulsions include water, an organic solvent, and surfactants. Often, microemulsions are used as cleaning formulations. For example, U.S. Pat. No. 4,909,962 describes a clear, single phase, pre-spotting composition provided in the form of a microemulsion, solution, or gel, this composition characterized as being infinitely dilutable with water without phase separation. Other references describe compositions useful in cleaning applications. In systems described as being oil continuous, the systems have low water contents. While predominately describing water continuous systems, some of the examples in U.S. Pat. No. 4,909,962 exemplify low water containing, oil continuous (water in oil) systems. While such formulations are known in a general sense, much research is dedicated toward finding new microemulsion and emulsion formulations. It is desirable to find new compositions for such purposes which possess high water contents and are oil continuous. Such oil continuous microemulsions are especially suitable to function as cleaning compositions to remove oil or grease.

SUMMARY OF THE INVENTION

This invention, in one respect, is a single phase oil continuous microemulsion useful as a liquid cleaning composition, comprising:

A. water in an amount greater than 40 percent by weight and less than 75 percent by weight based on the total weight of the microemulsion;

B. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives, and wherein the organic solvent or the mixture of two or more organic solvents are in an amount greater than 10 percent and less than 60 percent by weight based on the total weight of the microemulsion;

C. one or more ionic surfactants which are soluble in the one or more organic solvents, wherein the one or more ionic surfactants have an average molecular weight in the range from 350 to 700 exclusive of a counterion, and wherein the one or more ionic surfactants are present in a total amount greater than 0.1 percent and less than 10 percent by weight based on the total weight of the microemulsion;

the microemulsion characterized as being an oil continuous microemulsion having an electrical conductivity of less than Z (microSiemens/centimeter) when measured at use temperatures 25° C. and a viscosity less than 20 centistokes as measured at 25° C. wherein Z is represented by the following formula: $Z=(\frac{1}{3})(\Phi_w)^2\Sigma_i A_i m_i$, wherein $\Phi_w$ represents the volume fraction of water in the microemulsion, "i represents any given electrolyte which is present in the microemulsion". $A_i$ represents the molar conductivity of electrolyte i and $m_i$ represents the molarity of electrolyte i in the aqueous phase.

In another respect, this invention is an emulsion, which upon standing at 25° C. forms at least two phases wherein one phase is an oil continuous microemulsion, comprising:

A. water in an amount greater than 60 percent by weight and less than 95 percent by weight based on the total weight of the emulsion;

B. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives, and wherein the organic solvent or the mixture of two or more organic solvents are in an amount greater than 4 percent and less than 40 percent by weight based on the total weight of the emulsion;

C. one or more ionic surfactants which are soluble in the one or more organic solvents, wherein the one or more ionic surfactants have an average molecular weight in the range from 350 to 700 exclusive of a counterion, and wherein the one or more ionic surfactants are present in a total amount greater than 0.1 percent and less than 5 percent by weight based on the total weight of the microemulsion;

the emulsion characterized as being an oil continuous emulsion, wherein the emulsion has an electrical conductivity of less than Z (microSiemens/centimeter) when measured at 25° C. and a viscosity less than 20 centistokes as measured at 25° C. wherein Z is represented by the following formula: $Z=(\frac{1}{3})(\Phi_w)^2\Sigma_i A_i m_i$, wherein $\Phi_w$ represents the volume fraction of water in the microemulsion, "i represents any given electrolyte which is present in the emulsion", $A_i$ represents the molar conductivity of electrolyte i and $m_i$ represents the molarity of electrolyte i in the aqueous phase.

In still another respect, this invention is a cleaning concentrate, which when diluted with water may form the microemulsion or emulsion described above.

In yet another respect, this invention is a method for cleaning metal having grease or oily soil on a surface of the metal which comprises applying the microemulsion or the emulsion described above to the metal which has grease or oily soil on the surface of the metal to remove at least a portion of the grease or oily soil from the metal.

The microemulsions and emulsions of this invention find utility as liquid cleaning compositions for use in metal cleaning, hard surface cleaning, circuit board defluxing, automotive cleaning, cold cleaning, dry cleaning, paint stripping and fabric cleaning. Further, the microemulsions and emulsions are particularly effective for removing grease and oily substances. In household and personal care, the compositions of this invention can be used in laundry pretreaters, laundry detergents, coatings, skin cleansers, hair cleaning and conditioning formulations, and in aerosol, pump, spray or liquid pesticide formulations. A unique aspect of this invention is the advantage of forming high water containing compositions which are oil continuous.

DETAILED DESCRIPTION OF THE INVENTION

Microemulsions

As described above, the microemulsions of this invention contain as essential components water, an organic solvent, and one or more ionic surfactants. Such microemulsions and emulsions are characterized as being oil continuous and having a high water content. Microemulsions are generally considered to be compositions in thermodynamic equilibrium which have suspended particle sizes in the range from 50 to 1000 angstroms. "Electrolyte" as used herein means any solvated salts in the microemulsions or emulsion including ionic surfactant or add salts such as magnesium sulfate and soduim chloride. As used herein, "oil continuous" means compositions, either microemulsions or emulsions, which have an electrical conductivity below Z (microSiemens/centimeter) wherein Z is represented by the following formula: $Z=(1/3)(\Phi_w)^2 \Sigma_i A_i m_i$ wherein $\Phi_w$ represents the volume fraction of water in the composition, i represents a given electrolyte, $A_i$ represents the molar conductivity of electrolyte i and $m_i$ represents the molarity of electrolyte i in the aqueous phase. Thus, a composition 0.02 molar in an electrolyte having a molar conductivity of 120,000 (microSiemens×liter)/(centimeter×mol) and a volume fraction of water of 50 percent has a Z value of 200 and is therefore an oil continuous microemulsion below 200 microSiemens/centimeter (Z). Preferably, the compositions of this invention have an electrical conductivity below 0.5 Z, more preferably below 0.25 Z and most preferably below 0.1 Z. By contrast bicontinuous compositions are above Z and below 2 Z and water continuous compositions are above 2 Z.

In the single phase oil continuous microemulsions, the water is in an amount greater than 40 percent by weight and less than 75 percent by weight based on the total weight of the microemulsion. Preferably, the microemulsion contains greater than 45 weight percent water. Preferably, the microemulsions contain less than 70 weight percent water, more preferably less than 65 weight percent and even more preferably less than 60 weight percent.

In the single phase oil continuous microemulsions, an organic solvent or a mixture of two or more organic solvents is employed, wherein the organic solvent or mixture of organic solvents are characterized as containing no more than 2 weight percent water at 25° C. when the organic solvent is saturated with water in the absence of surfactants or other additives. Preferably, the organic solvent or mixture of organic solvents contain no more than 1 weight percent water at 25° C. when saturated, more preferably no more than 0.5 weight percent water. Water uptake of an organic solvent can be readily determined by water titration, for example, wherein water is added to the one or more organic solvents until cloudiness of solution is observed or an excess water phase develops. The organic solvent or the mixture of two or more organic solvents are present in an amount greater than 10 percent and less than 60 percent by weight based on the total weight of the microemulsion. Preferably, the organic solvent or the mixture of two or more organic solvents are present in an amount greater than 15 weight percent, more preferably greater than 20 percent, most preferably greater than 25 weight percent; preferably less than 50 weight percent.

Classes of organic solvents that can be used in the practice of this invention include aliphatic alcohols, aliphatic esters, aliphatic hydrocarbons, chlorinated aliphatic hydrocarbons, aromatic hydrocarbons, aliphatic diesters, aliphatic ketones, and aliphatic ethers. In addition, a solvent can contain two or more of these functional groups or can contain combinations of these functional groups. For example, alkylene glycol monoethers, alkylene glycol diethers and alkylene glycol ether acetates may be employed as solvents in the practice of this invention. As used herein, alkylene glycol ethers includes dialkylene glycol ethers. The alkylene glycol monoethers and alkylene glycol diethers are particularly useful to decrease viscosity of a microemulsion. Preferred classes of organic solvents are the aliphatic hydrocarbons, aromatic hydrocarbons, alkylene glycol monoethers, alkylene glycol diethers, and alkylene glycol ether acetates. More preferred classes of organic solvents are the aliphatic hydrocarbons, alkylene glycol monoethers, and alkylene glycol diethers.

The aliphatic alcohols can be primary, secondary or tertiary. Preferred aliphatic alcohols have 4 to 24 carbon atoms. Representative examples of more preferred aliphatic alcohols include octanol, 2-ethyl-hexanol, nonanol, dodecanol, undecanol, and decanol.

Preferred dialiphatic esters have 4 to 24 carbon atoms. Representative examples of more preferred dialiphatic esters include methyl laurate, methyl oleate, hexyl acetates, pentyl acetates, octyl acetates, nonyl acetates, and decyl acetates.

The aliphatic hydrocarbons can be linear, branched, cyclic or combinations thereof. Preferred aliphatic hydrocarbons contain 3 to 24 carbon atoms, preferably 6 to 24 carbon atoms. Representative examples of more preferred aliphatic hydrocarbons include alkanes such as liquid propane, butane, hexane, octane, decane, dodecane, hexadecane, mineral oils, paraffin oils, decahydronaphthalene, bicyclohexane, cyclohexane, and olefins such as 1-decene, 1-dodecene, octadecene, and hexadecene. Examples of commercially available aliphatic hydrocarbons are Norpar™ 12, 13, and 15 (normal paraffin solvents available from Exxon Corporation), Isopar™ G, H, K, L, M, and V (isoparaffin solvents available from Exxon Corporation), and Shellsol™ solvents (Shell Chemical Company).

Preferred chlorinated aliphatic hydrocarbons contain 1 to 12 carbon atoms, more preferably contain from 2 to 6 carbon atoms. Representative examples of more preferred chlorinated aliphatic hydrocarbons include methylene chloride, carbon tetrachloride, chloroform, 1,1,1-trichloroethane, perchloroethylene, and trichloroethylene.

Preferred aromatic hydrocarbons contain 6 to 24 carbon atoms. Representative examples of more preferred aromatic hydrocarbons include toluene, napthalene, biphenyl, ethyl benzene, xylene, alkyl benzenes such as dodecyl benzene, octyl benzene, and nonyl benzene.

Preferred aliphatic diesters contain 6 to 24 carbon atoms. Representative examples of more preferred aliphatic diesters include dimethyl adipate, dimethyl succinate, dimethyl glutarate, diisobutyl adipate, and diisobutyl maleate.

Preferred aliphatic ketones have 4 to 24 carbon atoms. Representative examples of more preferred aliphatic ketones include methyl ethyl ketone, diethyl ketone, diisobutyl ketone, methyl isobutyl ketone, and methyl hexyl ketone.

Preferred aliphatic ethers have 4 to 24 carbon atoms. Representative examples of more preferred aliphatic ethers include diethyl ether, ethyl propyl ether, hexyl ether, butyl ether, and methyl t-butyl ether.

Preferred alkylene glycol monoethers, dialkylene glycol monoethers, alkylene glycol diethers, and alkylene glycol ether acetates include propylene glycol diethers having 5 to 25 carbon atoms, propylene glycol ether acetates having 6 to 25 carbon atoms, propylene glycol monoethers having 7 to 25 carbon atoms, ethylene glycol ether acetates having 6 to 25 carbon atoms, ethylene glycol diethers having 6 to 25 carbon atoms, and ethylene glycol monoethers having 8 to 25 carbon atoms. Representative examples of more preferred solvents within this broad class include propylene glycol dimethyl ether, propylene glycol benzyl methyl ether, propylene glycol butyl methyl ether, propylene glycol dibutyl ether, dipropylene glycol dimethyl ether, dipropylene glycol butyl methyl ether, dipropylene glycol dibutyl ether; propylene glycol methyl ether acetate, dipropylene glycol methyl ether acetate, propylene glycol butyl ether acetate; propylene glycol monobutyl ether, propylene glycol monohexyl ether, dipropylene glycol monobutyl ether, dipropylene glycol monohexyl ether; ethylene glycol ethyl ether acetate, ethylene glycol butyl ether acetate, diethylene glycol butyl ether acetate; ethylene glycol diethyl ether, ethylene glycol dibutyl ether; ethylene glycol hexyl ether, ethylene glycol octyl ether, ethylene glycol phenyl ether, diethylene glycol hexyl ether, and diethylene glycol octyl ether. Most preferred alkylene glycol monoethers are propylene glycol monobutyl ether, dipropylene glycol monobutyl ether, propylene glycol monopropyl ether and dipropylene glycol monopropyl ether.

In preferred embodiments of the present invention, alkylene glycol monoethers are employed in admixture with one or more other organic solvents. The addition of alkylene glycol monoethers facilitates the preparation of low viscosity microemulsions and emulsions. The alkylene glycol monoether is present in an amount greater than 5 weight percent based on the total weight of the microemulsion, preferably greater than 10 weight percent, more preferably greater than 15 weight percent; less than 50 weight percent, preferably less than 40 weight percent and more preferably less than 25 weight percent. In general, the ratio of glycol ether to total surfactants should be greater than 2 to 1 in both microemulsions and emulsions. The alkylene glycol monoether is present in the emulsions containing 70–80 percent water in an amount greater than 5 weight percent based on the total weight of the emulsion, and less than 15 percent.

In the single phase oil continuous microemulsions, one or more ionic surfactants are employed which are soluble in the one or more organic solvents. The one or more ionic surfactants may also be characterized as possessing greater solubility in the one or more organic solvents than in water and preferentially partitioning into the organic solvent in a mixture of water and organic solvent. Typically, the one or more ionic surfactants are no more than sparingly water soluble. Here solubility does not include dispersability or emulsifiability. The one or more ionic surfactants have a molecular weight greater than 350 and less than 700. If two or more ionic surfactants are employed, "molecular weight" as used above is calculated based on the average of the molecular weights of the two or more ionic surfactants.

Useful anionic surfactants are employed which are soluble in the one or more organic solvents and no more than sparingly soluble in water and include salts of alkyl benzene sulfonates, alkyl toluene sulfonates, alkyl naphthyl sulfonates, petroleum sulfonates, alkyl sulfates, alkyl polyethoxy ether sulfates, paraffin sulfonates, alpha-olefin sulfonates, alpha-sulfocarboxylates and esters thereof, alkyl glyceryl ether sulfonates, fatty acid monoglyceride sulfates and sulfonates, alkyl phenol polyethoxy ether sulfates, 2-acyloxy-alkane-1-sulfonate, fatty acid salts, sulfated oils such as sulfated castor oil, and beta-alkyloxy alkane sulfonate. It should be noted that for some end uses, a small amount of a water soluble anionic or cationic surfactant may be useful.

A preferred class of ionic surfactants are anionic surfactants are of formula $R_xB$—$SO_3M$ wherein R represents alkyl, x is 1 or 2, B is a biradical when x is 1 or is a triradical when x is 2 and which is derived from an aromatic moiety and wherein M represents hydrogen or a cationic counterion and wherein the total number of carbons in $R_x$ is from 18 to 30. Preferably at least one anionic surfactant is of this formula. Molecular weight of an anionic surfactant of formula $R_xB$—$SO_3M$ is calculated exclusive of the molecular weight of M; that is, molecular weight is calculated for $R_xB$—$SO_3$ only. The anionic surfactants containing M as a counterion can be readily prepared from surfactants wherein M is hydrogen such as by reacting the sulfonic acid with a metal hydroxide including hydroxides of ammonium, lithium, sodium, potassium, magnesium, calcium. Selection of a particular M counterion is not critical so long as the resulting surfactant remains soluble in the organic solvent and no more than sparingly water soluble and provides anionic surfactants which are capable of producing the microemulsions and emulsions of this invention. Preferably, M is monovalent. Preferably, B is derived from benzene, toluene or naphthalene. Preferably, the anionic surfactants have a molecular weight greater than 400. Preferably, the anionic surfactants have a molecular weight less than 600 and more preferably less than 550.

An advantage of using the preferred anionic surfactants is that relatively small amounts of the preferred anionic surfactants are needed to provide the high water content, oil continuous microemulsions and emulsions of this invention. Consequently, the amount of residual anionic surfactant left on a surface cleaned with the microemulsions and emulsions is minimal, and problems of streaking and so forth are also minimal. Preferably, the preferred anionic surfactants are present in the microemulsions in an amount greater than 0.5 weight percent. Preferably, the preferred anionic surfactants are present in the microemulsions in an amount less than 6 percent and more preferably in an amount less than 5 percent.

Cationic surfactants having a molecular weight, or average of molecular weights, of preferably less than 600 are employed. The cationic surfactants are soluble in the organic solvent. The cationic surfactants may also be characterized as possessing greater solubility in the one or more organic solvents than in water and preferentially partitioning into the organic solvent in a mixture of water and organic solvent. Typically, the cationic surfactants are no more than sparingly water soluble. Useful cationic surfactants include quaternary ammonium surfactants such as octadecyl trimethyl ammonium chloride, octadecylpyridinium chloride, didodecyl dimethyl ammonium chloride and 1-benzyl-2-hexadecyl-3-hydroxy-ethyl imidazolinium chloride; primary, secondary, and tertiary ammonium salts such as octadecyl ammonium chloride, hexadecyl ethyl ammonium chloride; amine oxides; alkyl pyridinium surfactants; alkyl piperidinium surfactants; and imidazolinium surfactants.

When used, the one or more cationic surfactants are employed in an amount greater than 0.1 percent and less than 6 percent by weight based on the total weight of the microemulsion and preferably less than 3 weight percent.

In the single phase oil continuous microemulsions, one or more nonionic surfactants can be also be employed. The one or more nonionic surfactants are employed in an amount from 0 to 6 percent by weight based on the total weight of the microemulsion. Preferably, the one or more nonionic surfactants are employed in an amount less than 3 weight percent.

Nonionic surfactants employed in this invention include alkylphenol alkoxylates and primary and secondary alcohol alkoxylates wherein the alkoxylate can be ethoxy, propoxy, butoxy or combinations thereof. Mixtures of alcohol alkoxylates can be used. Preferred nonionic surfactants are alkylphenol ethoxylates and primary and secondary alcohol ethoxylates. The alkylphenol ethoxylates and primary and secondary alcohol ethoxylates are of the formula:

$$R-O-(CH_2CH_2O)_n-H$$

wherein R is a hydrocarbon containing 9 to 24 carbon atoms and n is from 1 to 9. Commercially available nonionic surfactants are sold by Shell Chemical Company under the name Neodol™ and by Union Carbide Corporation under the name Tergitol™. Representative examples of preferred commercially available nonionic surfactants include Tergitol™ 15-s-series and Neodol™ 91 or 25 series. Additional representative examples of useful nonionic surfactants include polyoxyethylated polypropylene glycols, polyoxyethylated polybutylene glycols, polyoxyethylated mercaptans, glyceryl and polyglyceryl esters of natural fatty acids, polyoxyethylenated sorbitol esters, polyoxyethylenated fatty acids, alkanol amide, tertiary acetylinic glycols, N-alkylpyrrolidones, and alkyl polyglycosides. More preferred nonionic surfactants employed in this invention are secondary alcohol ethoxylates. Representative examples of preferred commercially available secondary alcohol ethoxylates include Tergitol™ 15-s-3, Tergitol™ 15-s-5 and Tergitol™ 15-s-7.

The microemulsions of this invention may further contain other types of surfactants such as amphoteric surfactants with molecular weights above 350, betaines such as N-alkylbetaines including N,N,N-dimethyl-hexadecyl-amino-(3-propionate), and sulfobetaines such as N,N,N-dimethyl-hexadecyl-amino-propylene sulfonate.

Conductivity of a microemulsion of this invention is measured at use temperatures because conductivity can vary with temperature and, thus, the type of microemulsion can also change with temperature. It follows that it is possible to make a microemulsion which is not oil continuous and does not fall within the scope of this invention at room temperature, but which when heated to a higher use temperature is oil continuous and does fall within the scope of this invention. Electrical conductivity can be measured using standard techniques and conventional equipment, employing, for example, a Fisher brand model 326 conductivity meter which has a one centimeter gap between the anode and cathode in the probe. When such a device is used, the probe is simply immersed in the solution, the value allowed to equilibrate, and the conductivity observed from the device. It should be understood that the device must be calibrated using standard electrolyte solutions of known conductivity prior to measuring conductivity of compositions of this invention.

The microemulsions of this invention have a viscosity less than 40 centistokes as measured at use temperatures. Viscosity is measured at use temperatures because viscosity can vary with temperature. It follows that it is possible to make a microemulsion which is not within the scope of this invention at room temperature, but which when heated to a higher use temperature possesses a viscosity which does fall within the scope of this invention. Preferably, the single phase oil continuous microemulsions have a viscosity less than 30 centistokes, more preferably less than 20 centistokes, and even more preferably less than 10 centistokes and most preferably 8 centistokes. An advantage of preferred microemulsions of this invention is that upon dilution with water or oil, the viscosity of the resulting composition does not increase above 40 centistokes. Viscosity can be measured by well known methods using conventional equipment designed for such purpose. For example, a capillary viscometer such as a Cannon-Fenske capillary viscometer equipped with a size 350 capillary can be used following the procedure of ASTM D 445. Alternatively, a Brookfield Model LVT Viscometer with a UL adapter can be used to measure viscosities in centipoise.

It follows that the one or more surfactants are employed in an amount effective to form an oil continuous microemulsion, this amount varying depending on the amount and nature of the components in the entire microemulsion composition. It is equally important, however, that the microemulsions contain a high water content, generally above 40 weight percent based on the total weight of the composition. This being the case, the microemulsions are characterized as being compositions which are neither bicontinuous nor water-continuous.

A generalized methodology used to design high water, single phase microemulsion cleaning systems is as follows: (A) select an organic solvent or organic solvent blend having the desired low water uptake; (B) determine the relationship between surfactant structure (e.g., hydrophilicity) and conductivity, viscosity and phase behavior (e.g., the presence of liquid crystals) of compositions with the desired level of water, surfactants, organic solvent and additive contents by varying only the surfactant or surfactant blend composition; (C) the procedure of steps A and B may be repeated as necessary at several solvent and surfactant concentrations until the amount and types of solvent and surfactant necessary to give a single phase oil continuous structure at the desired water level (based on the information generated in step B) are determined; (D) determine the viscosity and conductivity of the oil-continuous microemulsion; (E) if viscosity is too high, it may be adjusted by reducing surfactant concentration, changing the solvent composition (e.g., by increasing the level of an oxygenated solvent such as glycol ether or alcohol), adding a second class of surfactant (e.g., nonionic to an anionic based system) or by adding electrolytes to up to 0.2 weight percent (excluding surfactant) or by changing the organic solvent to surfactant ratio, or by addition of an additional organic solvent, such as a glycol ether, to decrease viscosity; (F) if needed, adjust surfactant or surfactant blend composition (repeat step B, C, and D with new formulation) from step E to provide a single phase oil continuous microemulsion; and (H) confirm that viscosity and conductivity of the oil continuous microemulsion are within the scope of this invention. It should be noted that some steps may be deleted or repeated depending on the circumstances.

In general, optimum cleaning performance is obtained when the microemulsion systems are prepared with a minimum amount of surfactant. This leads to low residue and lower inherent viscosities (in the absence of liquid crystals). In order to determine the minimum amount of surfactant required, the methodology described above should be repeated at various surfactant levels for a given solvent system and water content. Typically, the minimum surfactant level is defined as the lowest surfactant level where one may transverse the region of microemulsion structures from water to oil continuous without the generation of any excess phases. In practice, it has been found that efficient systems (lowest surfactant levels) are obtained when one uses predominantly a high molecular weight ionic surfactant and then adjusts the phase behavior using a second component (either addition of small amounts of electrolyte or adjusting the solvent phase composition).

Another consideration when designing optimum oil continuous microemulsions is the avoidance of high viscosity regions during the cleaning process. When used, the microemulsions described here may be transformed from their oil continuous structure through the bicontinuous regime into the water continuous, via evaporation of solvent components giving a new solvent balance; solubilization of soils which may favor a water continuous structure; or addition of water during a water rinsing procedure. For this reason, the most preferred systems should maintain low viscosities not only in the oil continuous regime but also in the biand water continuous regions.

Addition of electrolyte is an effective method for adjusting phase behavior; however, increasing electrolyte content decreases surfactant efficiency. Therefore, total electrolyte contents (excluding surfactants) should be minimized.

Emulsions

The cleaning emulsions of this invention are well dispersed when sufficiently mixed; however, upon standing the emulsions form at least two phases wherein one phase is an oil continuous microemulsion. Typically, only two phases form when the emulsions are allowed to stand. As used herein, "standing " means allowed to sit undisturbed for 7 days at 25° C.

The emulsions of this invention contain water in an amount greater than 60 percent by weight and less than 95 percent by weight based on the total weight of the emulsion. Preferably, the emulsions contain water in an amount greater than 70 weight percent, more preferably greater than 75 weight percent; preferably less than 90 weight percent, more preferably less than 88 weight percent.

The types of organic solvents employed in the emulsions of this invention are the same as those described above under the Microemulsions heading, including all the classes of solvents, physical characteristics of the solvents, representative examples and preferred solvents. However, the amount of solvent employed in the emulsions of this invention is greater than 4 percent and less than 40 percent by weight based on the total weight of the emulsion. Preferably, the amount of solvent employed for an emulsion is greater than 8 weight percent, more preferably greater than 10 weight percent; preferably less than 25 weight percent, and more preferably less than 15 weight percent.

The descriptions of useful ionic surfactants and nonionic surfactants are the same as that described above under the Microemulsions heading. However, the amount of ionic surfactant employed is from 0.1 percent to 5 percent by weight based on the total weight of the emulsion. Preferably, the amount employed is less than 3 weight percent.

The definition used above to describe "oil continuous" compositions is also used to describe the emulsions. Conductivity is measured at use temperatures because conductivity can vary with temperature and, thus, the type of emulsion can also change with temperature. It follows that it is possible to make an emulsion which is not oil continuous and does not fall within the scope of this invention at room temperature, but which when heated to a higher use temperature is oil continuous and does fall within the scope of this invention.

In addition, the emulsions have a viscosity less than 40 centistokes as measured at use temperatures. Viscosity is measured at use temperatures because viscosity can vary with temperature. It follows that it is possible to make an emulsion which is not within the scope of this invention at room temperature, but which when heated to a higher use temperature possesses a viscosity which does fall within the scope of this invention. Preferably, the emulsions have a viscosity less than 20 centistokes, more preferably less than 10 centistokes.

A generalized methodology utilized to design high water emulsion cleaning systems is as follows: (A) select an organic solvent or organic solvent blend having the desired low water uptake; (B) determine the relationship between surfactant structure (e.g., hydrophilicity) and conductivity of a composition with the desired water, surfactants, organic solvent, and additive contents by varying only the surfactant or surfactant blend composition; (C) the procedure of steps A and B may be repeated as necessary at several solvent and surfactant concentrations until the amount and types of solvent and surfactant necessary to give an oil continuous emulsion structure at the desired water level (based on the information generated in step B) are determined; (D) determine the viscosity, conductivity and water content of the emulsion, stability (time to phase separation) of the oil continuous emulsion; (E) if viscosity is too high, it may be adjusted by adjusting surfactant concentration, organic solvent to surfactant ratio, or by addition of an additional organic solvent, such as a glycol ether, to decrease viscosity; (F) if needed, adjust surfactant or surfactant blend composition (repeat step B, C, and D with new formulation from step E) to provide an oil continuous emulsion; and (H) confirm that viscosity and conductivity of the oil continuous microemulsion are within the scope of this invention. It should be noted that some steps may be deleted or repeated depending on the circumstances.

Optionals

In addition to the required components listed above for microemulsions and emulsions, respectively, a variety of optional materials may be added depending on end use, desired physical properties of the microemulsion or emulsion, and the like. Hence, various detergent additives, chelating agents, sequestering agents, suspension agents, perfumes, enzymes (such as the lipases and protiases), brighteners, preservatives, corrosion inhibitors, phosphatizing agents, UV absorbers, disinfectants, biologically active compounds such as pesticides, herbicides, fungicides and drugs, fillers, and dyes may be included in a microemulsion or emulsion of this invention.

The following examples are included for the purposes of illustration only and are not to be construed to limit the scope of the invention or claims. Unless otherwise indicated, all parts and percentages are by weight. In all examples, viscosities were measured at 25° C. using ASTM D 445 on a Cannon-Fenske capillary viscometer using a size 350 capillary or on a Brookfield Model LVT Viscometer with a UL adapter.

In the examples, cleaning performance of the microemulsions and emulsions for the removal of Conoco HD grease (Conoco Oil Co.) was determined by a gravimetric technique. Thus, cold rolled steel coupons (1-7/8"×1/2"×1/16") were coated with 0.10 grams of grease weighed out on an analytical balance (Mettler ae 260) to 0.1 mg. These were then placed in the cleaning solution to be tested and placed in a shaker bath (Polystat™ model 1200-00) set at 160 rpm for two minutes at 25° C. The coupons were than removed from the cleaning solution and rinsed with deionized water after which the coupons were allowed to air dry for four hours. The coupons were then reweighed on an analytical balance to determine the amount of grease remaining and the percentage of grease removed was calculated. Prior to use, the sodium alkyl toluene sulfonates used in the examples were treated to remove residual sulfate salts and alkyl toluene disulfonate by extraction of a solution of surfactant in PnB using aqueous hydrogen peroxide followed by neutralization using aqueous sodium hydroxide. When data is presented in the tables below, the data below the phrase "Conoco HD" represents the weight percentages of grease removed from the coupon. In all text in the examples and the tables, the phrase "Cond." denotes conductivity as expressed in microSiemens/centimeter as measured at 25° C., the phrase "Visc." denotes viscosity as expressed in centistokes as measured at 25° C., "bi" denotes bicontinuous microemulsions, "PnB" denotes propylene glycol n-butyl ether (DOWANOL™ PnB obtained from The Dow Chemical Company), "PnP" denotes propylene glycol n-propyl ether (DOWANOL™ PnP obtained from The Dow Chemical Company), "sodium $C_{20-24}$ alkyl toluene sulfonate" and "NaATS"denote the sodium salt of $C_{20-24}$ alkyl toluene sulfonic acid (the acid being obtained from Pilot Chemical Corporation as Aristol™ F and $C_{20-24}$ describing alkyl of 20–24 carbons), "sodium octadecyl toluene sulfonate" and "NaODTS" denote the sodium salt of octadecyl toluene sulfonic acid (the acid being obtained from Pilot Chemical Corporation as Aristol™ G), "w/o" denotes oil continuous microemulsions, "EDTA" means tetrasodium ethylenediamine tetraacetate and all percentages ("%") are by weight.

EXAMPLE 1

The generalized methodology for making micro-emulsions of this invention described above can be illustrated by this example to produce a low viscosity, single phase oil continuous (water in oil) microemulsion containing 50 weight percent water. The first step is to choose an organic solvent. For this example, a hydrocarbon with low water uptake, dodecane, was selected. Next, the water level of the composition was fixed at 50 weight percent. Using a surfactant level of 10 weight percent and a dodecane level of 40 weight percents the following Table 1A was generated. TRS-10, TRS-16, TRS-18, and TRS-HMW are petroleum sulfonate (anionic) surfactants (Witco Corporation). In this and succeeding tables, the symbol "0*" denotes that water in the organic phase is below the detectable limit using the measuring technique employed. In this and succeeding tables, water contents were determined in two phase systems using phase volume ratios and densities of components. While these theoretical calculations are good estimates, the actual water content may be slightly different than calculated by another method.

TABLE 1A

| TRS-x | Equivalent MW of surfactant | Cond. | % Water in organic solvent phase | Z |
|---|---|---|---|---|
| 10 | 420 | 3100 | 0* | 1090 |
| 16 | 450 | 3050 | 0* | 1020 |
| 18 | 495 | 33.1 | 38.1 | 920 |
| HMW | 520 | 12.9 | 10.0 | 880 |

This system did not give a single phase microemulsion with any of the anionic surfactants used. The greatest water content achieved in this series was 38 weight percent water with 40 weight percent dodecane and 10 weight percent TRS-18. The above systems formed a large amount of liquid crystals or gels which may have reduced the effectiveness of the anionic surfactant used. Thus, this experiment did not yield usable microemulsions.

A second series of systems containing 50 weight percent water, 40 weight percent of Norpar™ 12, and 10 weight percent surfactant. Norpar™ 12 is a commercially available hydrocarbon mixture, containing 44 percent dodecane, 36 percent undecane, 13 percent decane, 7 percent tridecane, 1.1 percent cycloparaffins, 0.6 percent monoaromatics, and 0.2 percent isoparaffins, available from Exxon Corporation. The results are shown in Table 1B.

TABLE 1B

| TRS-x | Equivalent MW of surfactant | Cond. | % Water in organic solvent phase | Z |
|---|---|---|---|---|
| 10 | 420 | 2730 | 0* | 1090 |
| 16 | 450 | 1820 | 0* | 1020 |
| 1:1 16/18 | 472.5 | 955 | 0* | 970 |
| 18 | 495 | 0.14 | 20.1 | 920 |
| HMW | 520 | 53 | gel | 880 |

In Table 1B all samples except the TRS-10 based sample contained large amounts of insoluble gels, with the TRS-10 based sample having a conductivity of 2730 microSiemens/centimeter which describes a water continuous system which is not an aspect of the invention. The TRS-16 and TRS-16/18 based systems were gelled systems, not oil continuous microemulsion systems. Thus, this experiment did not yield usable microemulsions.

A third series of systems based on a solvent blend, 60/40 Norpar# 12/dipropylene glycol n-butyl ether (DOWANOL® DPnB), was prepared and the results shown below for TRS-HMW based microemulsion systems. In addition, a nonionic surfactant (Tergitol™ 15-s-3, Union Carbide Corporation) was ad ded. Tergitol# 15-s-3 is a secondary alcohol ethoxylate having an average of about 3-ethoxylate units wherein the hydrophobe end ranges from about undecyl ($C_{11}$) through about pentadecyl ($C_{15}$). The compositions and characteristics of the microemulsions as well as the cleaning performance data are shown below in Table 1C.

TABLE 1C

| % Solvent | % TRS-HMW | % Water | % 15-s-3 | Cond. | Visc. | Conoco HD | Z |
|---|---|---|---|---|---|---|---|
| 41.18 | 5.88 | 47.06 | 5.88 | 5.6 | 21.8 | 36.2 | 620 |
| 41.47 | 5.92 | 47.39 | 5.21 | 5.2 | 21.3 | 41.1 | 630 |
| 40.46 | 8.09 | 48.54 | 2.91 | 12.6 | 23.2 | 53.2 | 880 |
| 40.75 | 8.15 | 48.9 | 2.2 | 141.1 | 18.9 | 33.5 | 890 |
| 39.41 | 9.85 | 49.26 | 1.48 | 9.2 | 20.0 | 34.6 | 1080 |

It is seen in the data from Table 1C that single phase microemulsions have been produced which show excellent efficacy in removing grease in the Conoco test. The addition of glycol ether solvent serve to eliminate the insoluble gels observed in the first two systems above and to shift the transition from water to oil continuous microemulsions to higher anionic surfactant equivalent molecular weights. It is noted that the amount of nonionic surfactant needed to give an oil continuous structure increased as the ratio of glycol ether to anionic surfactant increased.

COMPARATIVE EXPERIMENT 1

Not an embodiment of the invention

The procedure of Example 1 for Table 1C was repeated except microemulsions were made having conductivities above Z microSiemens/centimeter. These microemulsions were then tested. The results are shown in Table 2.

TABLE 2

| % Solvent | % TRS-HMW | % Water | % 15-s-3 | Cond. | Visc. | Conoco HD | Z |
|---|---|---|---|---|---|---|---|
| 42.68 | 6.10 | 48.78 | 2.44 | 1373 | 11.7 | 18.4 | 660 |
| 41.67 | 8.33 | 50.00 | 0 | 2200 | 11.6 | 20.1 | 930 |
| 39.60 | 9.90 | 49.51 | 1.00 | 2100 | 29.8 | 7.6 | 1090 |
| 40.00 | 10.00 | 50.00 | 0 | 2200 | 31.9 | 4.0 | 1110 |

When the data in Table 2 is compared to the data in Table 1C, it is seen that the microemulsions in Table 1C possess superior cleaning ability relative to those shown in Table 2. In Table 2, the microemulsions have a high conductivity and are, therefore, not oil continuous microemulsions, unlike the compositions of Table 1C.

EXAMPLE 2

Microemulsions were prepared having the compositions set forth in Table 3, prepared in accordance with the general methodology of Example 1, and including magnesium sulfate which served to adjust the microemulsion structure. The anionic surfactant was sodium octadecyl toluene sulfonate. All the compositions in Table 3 were clear, single phase, oil continuous microemulsions.

EXAMPLE 3

Modified microemulsions of Example 2 were prepared by placing the compositions described in Example 2 in 4 oz. glass aerosol bottles which were then pressurized with propane to 6 weight percent to give the compositions as described in Table 4. All the compositions described in Table 4 were clear and stable

TABLE 3

| % Heptane | % Surfactant | % Water | % PnB | % MgSO$_4$ | Cond. | Visc. | Z |
|---|---|---|---|---|---|---|---|
| 26.4 | 6 | 49.96 | 17.6 | 0.04 | 5.7 | | 1270 |
| 26.4 | 6 | 49.97 | 17.6 | 0.03 | 94 | | 1250 |
| 26.5 | 6 | 49.975 | 17.6 | 0.025 | 160 | 13 | 1240 | with no formation of excess water. The conductivities were measured by spraying the bottle contents into a beaker and measuring the conductivity before a significant amount of the propellant escaped. Viscosities of the samples with propane added were estimated to be less than 13 centistokes by visual comparison to the original sample compositions in identical containers without propane pressurization

TABLE 4

| % Heptane | % Surfactant | % Water | % PnB | % MgSO$_4$ | Cond. | Visc. | Z |
|---|---|---|---|---|---|---|---|
| 24.8 | 5.64 | 47.03 | 16.5 | 0.028 | 48 | <13 | 0105 |
| 24.8 | 5.64 | 47.04 | 16.5 | 0.023 | 85 | <13 | 0105 |

EXAMPLE 4

Microemulsions were prepared having the compositions set forth in Table 5, prepared in accordance with the general methodology of Example 1, and including small amounts of sodium dodecyl benzene sulfonate ("NaDBS") which served as a supplemental anionic surfactant. The anionic surfactant was sodium octadecyl toluene sulfonate. All the compositions in Table 5 were clear, single phase, oil continuous microemulsions.

TABLE 5

| % d-limonene | % NaODTS | % Water | % PnB | % NaDBS | Cond. | Visc. | Z |
|---|---|---|---|---|---|---|---|
| 25.8 | 7.0 | 50 | 17.2 | 0 | 4.5 | not measured | 1560 |
| 25.8 | 6.53 | 50 | 17.2 | 0.47 | 33 | not measured | 1590 |
| 25.8 | 6.3 | 50 | 17.2 | 0.7 | 130 | 16 | 1610 |

EXAMPLE 5

Microemulsions were prepared by placing the compositions in 4 oz. glass aerosol bottles which were then pressurized with propane to 6 weight percent to give the compositions as described in Table 6. All the compositions described in Table 6 were clear and stable with no formation of excess water. The conductivities were measured by spraying the bottle contents into a beaker and measuring the conductivity before a significant amount of the propellant escaped. Viscosities of the samples with propane added were estimated by visual comparison to reference compositions in identical containers without propane pressurization.

TABLE 6

| % d-limonene | % NaODTS | % Water | % PnB | % NaDBS | Cond. | Visc. | Propane | Z |
|---|---|---|---|---|---|---|---|---|
| 24.2 | 5.64 | 47 | 16.2 | 0.94 | 21 | <20 | 6 | 1380 |
| 24.2 | 5.48 | 47 | 16.2 | 1.1 | 78 | <20 | 6 | 1390 |

EXAMPLE 6

Microemulsions based on perchloroethylene were prepared in accordance with the procedure of Example 1. A first clear, single phase oil continuous microemulsion contained 6 percent sodium octadecyl toluene sulfonate, 17.6 percent perchloroethylene, 6.6 percent heptane, 0.05 percent EDTA, 19.8 percent PnB and 50 percent water and had a Z value of 1790, an electrical conductivity of 70 microSiemens/centimeter and a viscosity below 40 centistokes. A second microemulsion similar to the first was prepared, which also contained sodium dodecyl benzene sulfonate, and was loaded into an aerosol can and then charged with propane according to the procedure of Example 3. Analysis of the discharged contents (clear, single phase) of the can contained 5.08 percent sodium octadecyl toluene sulfonate, 0.56 percent sodium dodecyl benzene sulfonate, 16.5 percent perchloroethylene, 6.2 percent heptane, 6 percent propane, 0.05 percent EDTA, 18.6 percent PnB and 47 percent water and had a Z value of 1510, an electrical conductivity of 61 microSiemens/centimeter and a viscosity below 40 centistokes.

EXAMPLE 7

A clear, single phase oil continuous microemulsion was prepared in accordance with the procedure of Example 1 having the following composition: 5 percent sodium $C_{20-24}$ alkyl toluene sulfonate, 27 percent Norpar™ 13, 18 percent dipropylene glycol n-butyl ether (DOWANOL™ DPnB, The Dow Chemical Company), 0.05 percent EDTA, 49.6 percent water and 0.15 percent $MgSO_4$. This microemulsion had a Z value of 1040, an electrical conductivity of 135 microSiemens/centimeter and a viscosity of 21.7 centistokes.

EXAMPLE 8

Microemulsions were prepared containing a solvent consisting of heptane and PnB and/or PnP, an anionic surfactant of sodium $C_{20-24}$ alkyl toluene sulfonate and a secondary anionic surfactant of sodium dodecyl benzene sulfonate, heptane and water. EDTA was added to the water phase to give a pH of 10 (0.05 percent). All microemulsions shown in Tables 7 and 8 are single phase and clear. Addition of a small amount of electrolyte ($MgSO_4$) allows the generation of oil continuous microemulsions systems which has low viscosity as shown in Table 7. In addition, the first sample shown in Table 7 when pressurized with 6 and 10 weight percent propane to yield the second and third samples in accordance with the method described in Example 3 yields oil continuous microemulsion with the desired viscosity and conductivity.

Formulations containing PnP and $MgSO_4$ are shown in Table 8. Addition of propane to the bicontinuous samples in accordance with the procedure described in Example 3 yields oil continuous, low viscosity microemulsions.

TABLE 7

| % NaATS | % NaDBS | % Heptane | % PnB | % $H_2O$ | % $MgSO_4$ | % Propane | Cond. | Visc. | Z | Structure |
|---|---|---|---|---|---|---|---|---|---|---|
| 4.0 | 1.0 | 27.0 | 18.0 | 49.93 | 0.02 | 0 | 700 | 9.4 | 1040 | w/o |
| 3.76 | 0.094 | 25.38 | 16.9 | 46.93 | 0.019 | 6 | 420 | <12 | 880 | w/o |
| 3.6 | 0.9 | 24.3 | 16.2 | 44.94 | 0.018 | 10 | 160 | <12 | 790 | w/o |
| 4.0 | 1.0 | 27.0 | 18.0 | 49.915 | 0.035 | 0 | 28 | 10.5 | 1050 | w/o |

TABLE 8

| % NaATS | % NaDBS | % Heptane | % PnB | % PnP | % H₂O | % MgSO₄ | % Propane | Cond. | Visc. | Z | Structure |
|---|---|---|---|---|---|---|---|---|---|---|---|
| 4.0 | 1.0 | 27.0 | 13.5 | 4.5 | 49.915 | 0.035 | 0 | 1390 | 6.8 | 1050 | bi |
| 3.76 | 0.094 | 25.38 | 12.7 | 4.23 | 46.92 | 0.033 | 6 | 780 | <10 | 890 | w/o |
| 3.6 | 0.9 | 24.3 | 12.15 | 4.05 | 44.92 | 0.0315 | 10 | 140 | <10 | 800 | w/o |
| 4.3 | 0.5 | 27.12 | 11.3 | 6.78 | 49.914 | 0.036 | 0 | 1397 | 6 | 960 | bi |
| 4.04 | 0.47 | 25.49 | 10.62 | 6.37 | 46.92 | 0.034 | 6 | 720 | <10 | 820 | w/o |
| 3.87 | 0.45 | 24.41 | 10.17 | 6.1 | 44.92 | 0.032 | 10 | 185 | <10 | 740 | w/o |
| 3.65 | 0.425 | 23.05 | 9.61 | 5.76 | 42.42 | 0.031 | 15 | 21 | <10 | 650 | w/o |
| 4.3 | 0.5 | 27.12 | 11.3 | 6.78 | 49.892 | 0.058 | 0 | 110 | 7.7 | 990 | w/o |

EXAMPLE 9

Microemulsions were prepared containing a solvent consisting of heptane and PnB and PnP, an anionic surfactant of sodium $C_{20-24}$ alkyl toluene sulfonate, 0.05 percent EDTA and MgSO₄ as shown in Table 9. All microemulsions shown in Table 9 are single phase and clear. Addition of percent propane in accordance with the procedure described in Example 3 to a bicontinuous microemulsion (1490 μS/cm) gives a low viscosity, oil continuous microemulsion as shown in Table 9.

TABLE 9

| % NaATS | % Heptane | % PnB | % PnP | % H₂O | % MgSO₄ | % Propane | Cond. | Visc. | Z | Structure |
|---|---|---|---|---|---|---|---|---|---|---|
| 4.0 | 27.6 | 9.2 | 9.2 | 49.93 | 0.02 | 0 | 1490 | 6.5 | 780 | bi |
| 4.0 | 27.6 | 9.2 | 9.2 | 49.915 | 0.035 | 0 | 620 | 6.1 | 790 | w/o |
| 3.6 | 24.8 | 8.3 | 8.3 | 44.95 | 0.018 | 10 | 185 | <10 | 600 | w/o |
| 4.0 | 27.6 | 9.2 | 9.2 | 49.91 | 0.04 | 0 | 156 | 6.7 | 790 | w/o |

EXAMPLE 10

Oil continuous, single phase microemulsions were prepared containing the following composition: (1) 2.7 percent 1-octanol, 26.9 percent heptane, 8.9 percent PnB, 8.9 percent PnP, 48.6 percent water, 0.05 percent EDTA, 3.9 percent of an anionic surfactant of sodium $C_{20-24}$ alkyl toluene sulfonate, the composition having a Z of 750, a conductivity of 180 microSiemens/-centimeter and a viscosity of 8.3 centistokes and (2) 1.5 percent 1-octanol, 26.6 percent heptane, 8.9 percent PnB, 8.9 percent PnP, 49.3 percent water, 4.9 percent of an anionic surfactant of sodium $C_{20-24}$ alkyl toluene sulfonate, the composition having a Z of 880, a conductivity of 130 microSiemens/centimeter and a viscosity of 10.5 centistokes. This example shows oil continuous microemulsions can be prepared without addition of electrolyte other than ionic surfactant.

EXAMPLE 11

Microemulsions were prepared containing a solvent consisting of d-limonene and PnB and/or PnP, an anionic surfactant of sodium $C_{20-24}$ alkyl toluene sulfonate and a second anionic surfactant (sodium dodecyl benzene sulfonate) and water as shown in Table 10. EDTA (0.05 percent) was also added to each composition in this Example. In Table 11, a oxygenated solvent mixture was employed of PnB and PnP as shown in Table 11. Addition of 6 weight percent propane to a bicontinuous sample gave an oil continuous microemulsion having low viscosity. Further addition of MgSO₄ or toluene as shown in Table 12 reduces the conductivity further into the oil continuous regime. All microemulsions shown in Tables 10–12 are single phase and clear.

TABLE 10

| % NaATS | % NaDBS | % d-Limonene | % PnB | % H₂O | Cond. | Visc. | Z | Structure |
|---|---|---|---|---|---|---|---|---|
| 4.5 | 0.5 | 27 | 18 | 49.95 | 78 | 27.5 | 1080 | w/o |
| 4.75 | 0.25 | 27 | 18 | 49.95 | 14.8 | 20.2 | 1060 | w/o |

TABLE 11

| % NaATS | % NaDBS | % d-Limoene | % PnB | % PnP | % H₂O | % MgSO₄ | % Propane | Cond. | Visc. | Z | Structure |
|---|---|---|---|---|---|---|---|---|---|---|---|
| 4.3 | 0.5 | 27.12 | 9.04 | 9.04 | 49.925 | 0.025 | 0 | 1730 | 8.2 | 1050 | bi |
| 4.04 | 0.47 | 25.5 | 8.5 | 8.5 | 46.93 | 0.023 | 6 | 430 | <10 | 890 | w/o |

TABLE 12

| % NaATS | % NaDBS | % d-Limonene | % PnB | % PnP | % H$_2$O | % MgSO$_4$ | Cond. | Visc. | Z | Structure |
|---|---|---|---|---|---|---|---|---|---|---|
| 4.3 | 0.5 | 27.12 | 9.04 | 9.04 | 49.895 | 0.055 | 600 | 9 | 1070 | w/o |
| 3.87 | 0.45 | 24.4 | 8.14 | 8.14 | 44.93 | 0.022 | 104 |  | 860 | w/o* |

*Denotes 10 percent toluene added in this composition

EXAMPLE 12

Microemulsions were prepared containing a solvent consisting of a dearomatized hydrocarbon (Exxsol D-60) and PnB and/or PnP, sodium C$_{20-24}$ alkyl toluene sulfonate and a second anionic surfactant (sodium dodecyl benzene sulfonate) and water as shown in Tables 13–15. EDTA (0.05 percent) was also added to each microemulsion in this Example. In Table 14, the inclusion of the PnP resulted in a reduction in viscosity relative to the microemulsion samples prepared without it. When propane was added according to the procedure outlined in Example 3 to a bicontinuous microemulsion (conductivity =1850 μS/cm) low viscosity, oil continuous microemulsions were obtained. In Table 15, three other oil continuous microemulsions are shown. The first entry contains increased levels of MgSO$_4$. The second entry contains a small amount of 1-octanol as shown and the third entry contains a small amount of toluene. In each case low viscosity, oil continuous microemulsions were obtained. All microemulsions shown in Tables 13–15 are single phase and clear.

and/or PnP, an anionic surfactant of sodium C$_{20-24}$ alkyl toluene sulfonate and a second anionic surfactant (sodium dodecyl benzene sulfonate) and water as shown in Table 16–18. EDTA (0.05 percent) was also added to each microemulsion in this Example. Table 17 shows the effect of addition of propane to an oil continuous microemulsion to provide additional low viscosity. All microemulsions shown in Tables 16–18 are single phase and clear.

TABLE 13

| % NaATS | % NaDBS | % Exxsol D-60 | % PnB | % H$_2$O | Cond. | Visc. | Z | Structure |
|---|---|---|---|---|---|---|---|---|
| 4.5 | 0.5 | 27 | 18 | 49.95 | 543 | 16.2 | 1040 | w/o |
| 4.75 | 0.25 | 27 | 18 | 49.95 | 11.4 | 14 | 1020 | w/o |

TABLE 14

| % NaATS | % NaDBS | % Exxsol D-60 | % PnB | % PnP | % H$_2$O | % MgSO$_4$ | % Propane | Cond. | Visc. | Z | Structure |
|---|---|---|---|---|---|---|---|---|---|---|---|
| 4.4 | 0.6 | 27.0 | 15.75 | 2.25 | 49.925 | 0.025 | 0 | 1850 | 8.5 | 1070 | bi |
| 3.96 | 0.54 | 24.3 | 14.35 | 2.02 | 44.93 | 0.0225 | 10 | 680 | <15 | 800 | w/o |
| 3.74 | 0.51 | 22.95 | 13.39 | 1.91 | 42.43 | 0.0213 | 15 | 170 | <15 | 710 | w/o |

TABLE 15

| % NaATS | % NaDBS | % d-Limonene | % PnB | % PnP | % H$_2$O | % MgSO$_4$ | Cond. | Visc. | Z | Structure |
|---|---|---|---|---|---|---|---|---|---|---|
| 4.4 | 0.6 | 27.0 | 15.75 | 2.25 | 49.895 | 0.055 | 190 | 13 | 1080 | w/o |
| 4.29* | 0.586 | 26.32 | 15.36 | 2.19 | 48.68 | 0.0244 | 150 | 12 | 1020 | w/o |
| 4.09** | 0.56 | 25.1 | 2.09 | 2.09 | 46.4 | 0.023 | 50 | 13.5 | 920 | w/o |

*Plus 2.5% 1-octanol
**With 7% toluene

EXAMPLE 13

Microemulsions were prepared containing a solvent consisting of a chlorinated hydrocarbon (perchloroethylene, "Perc" in the rabies), a hydrocarbon (heptane), and PnB

TABLE 16

| % NaATS | % NaDBS | % Perc. | % Heptane | % PnB | % PnP | % H₂O | Cond. | Visc. | Z | Structure |
|---|---|---|---|---|---|---|---|---|---|---|
| 4.75 | 0.25 | 18 | 6.75 | 15.75 | 4.5 | 49.95 | 63.4 | 10.5 | 1370 | w/o |

TABLE 17

| % NaATS | % NaDBS | % Perc. | % Heptane | % PnB | % PnP | % H₂O | % MgSO₄ | % Propane | Cond. | Visc. | Z | Structure |
|---|---|---|---|---|---|---|---|---|---|---|---|---|
| 4.0 | 1.0 | 18.0 | 6.75 | 15.75 | 4.5 | 49.935 | 0.02 | 0 | 1405 | 8.2 | 1480 | w/o |
| 3.76 | 0.94 | 16.92 | 6.34 | 14.8 | 4.23 | 46.935 | 0.019 | 6 | 940 | <10 | 1210 | w/o |
| 3.6 | 0.9 | 16.2 | 6.07 | 14.17 | 4.05 | 44.9 | 0.018 | 10 | 420 | <10 | 1070 | w/o |

TABLE 18

| % NaATS | % NaDBS | % Perc. | % Heptane | % PnB | % PnP | % H₂O | % MgSO₄ | Cond. | Visc. | Z | Structure |
|---|---|---|---|---|---|---|---|---|---|---|---|
| 4.5 | 0.5 | 18.0 | 6.75 | 11.25 | 9.0 | 49.934 | 0.016 | 1440 | 7.2 | 1420 | bi |
| 4.5 | 0.5 | 18.0 | 6.75 | 11.25 | 9.0 | 49.914 | 0.036 | 420 | 8.0 | 1430 | w/o |
| 4.43* | 0.49 | 17.7 | 6.65 | 11.08 | 8.87 | 49.2 | 0.016 | 620 | 8.5 | 1370 | w/o |
| 4.09** | 0.45 | 16.36 | 6.14 | 10.23 | 8.18 | 45.39 | 0.01455 | 190 | 9.3 | 1140 | w/o |

*Contains 1.5% 1-octanol/**contains 9.1% toluene

EXAMPLE 14

Microemulsions were prepared containing a solvent consisting of a chlorinated hydrocarbon (methylene chloride), an aliphatic hydrocarbon (heptane) and/or an aromatic hydrocarbon (toluene), PnB and/or PnP, an anionic surfactant of sodium $C_{20-24}$ alkyl toluene sulfonate and a second anionic surfactant (sodium dodecyl benzene sulfonate) and water as shown in Tables 19 and 20. EDTA (0.05 percent) was also added to each microemulsion in this Example. Microemulsions also containing a small amount of MgSO₄ generated an oil continuous microemulsion while maintaining low viscosity. All microemulsions shown in Tables 19 and 20 are single phase and clear.

PnP, 1 percent 2-heptanol, 0.0094 percent magnesium sulfate, 0.07 percent EDTA, 0.07 percent sodium sulfate and 69.3 percent water, which had a conductivity of 210 micro-Siemens/centimeter, a viscosity of 19 centistokes and a Z value of 1170 and (2) 3.2 percent sodium $C_{20-24}$ alkyl toluene sulfonate, 0.26 percent sodium dodecyl benzene sulfonate, 14 percent heptane, 7.7 percent PnB, 4 percent PnP, 1 percent 2-heptanol, 0.0094 percent magnesium sulfate, 0.07 percent EDTA, 0.07 percent sodium sulfate and 68.8 percent water, which had a conductivity of 470 micro-Siemens/centimeter, a viscosity of 15 centistokes, a Z value of 1150.

TABLE 19

| % NaATS | % NaDBS | % CH₂Cl₂ | % Toluene | % PnB | % PnP | % H₂O | % MgSO₄ | Cond. | Visc. | Z | Structure |
|---|---|---|---|---|---|---|---|---|---|---|---|
| 4.0 | 2.0 | 17.6 | 11 | 8.8 | 6.6 | 49.92 | 0.03 | 330 | 10.7 | 1710 | w/o |
| 4.0 | 2.0 | 17.6 | 11 | 8.8 | 6.6 | 49.913 | 0.037 | 185 | 12.7 | 1710 | w/o |

TABLE 20

| % NaATS | % NaDBS | % CH₂Cl₂ | % Heptane | % Toluene | % PnB | % PnP | % H₂O | % MgSO₄ | Cond. | Visc. | Z | Structure |
|---|---|---|---|---|---|---|---|---|---|---|---|---|
| 4.0 | 2.0 | 17.6 | 4.4 | 6.6 | 8.8 | 6.6 | 49.935 | 0.015 | 380 | 14 | 1670 | w/o |
| 4.0 | 2.0 | 17.6 | 4.4 | 6.6 | 8.8 | 6.6 | 49.9275 | 0.0225 | 160 | 12.7 | 1680 | w/o |

EXAMPLE 15

Microemulsions were prepared containing a solvent of heptane, PnB and PnP. Two low viscosity, single phase, oil continuous microemulsions were prepared having the following compositions: (1) 3.2 percent sodium $C_{20-24}$ alkyl toluene sulfonate, 0.26 percent sodium dodecyl benzene sulfonate, 14 percent heptane, 7.7 percent PnB, 3.5 percent

EXAMPLE 16

Microemulsions were prepared containing a solvent consisting of a dearomatized hydrocarbon (Exxsol™ D-60), PnB and PnP. Two low viscosity, single phase, oil continuous microemulsions were prepared having the following compositions: (1) 3.3 percent sodium $C_{20-24}$ alkyl toluene sulfonate, 0.31 percent sodium dodecyl benzene sulfonate, 14 percent dearomatized hydrocarbon, 10 percent PnB, 1.2 percent PnP, 1 percent 2-heptanol, 0.013 percent magnesium sulfate, 0.07 percent EDTA, 0.1 percent sodium sulfate and 69.9 percent water, which had a conductivity of 490 microSiemens/centimeter, a viscosity of 19.3 centistokes and a Z value of 1250 and (2) 3.3 percent sodium $C_{20-24}$ alkyl toluene sulfonate, 0.31 percent sodium dodecyl benzene sulfonate, 14 percent dearomatized hydrocarbon, 10 percent PnB, 1.7 percent PnP, 1 percent 2-heptanol, 0.013 percent magnesium sulfate, 0.07 percent EDTA, 0.1 percent sodium (DPnB), and dipropylene glycol monopropyl ether (DPnP), isononyl alcohol (Exxsol™ 9 from Exxon Chemical Company), a blend of nonionic surfactant (Igepal™ DM 430 and Igepal™ DM 530 from Rhone Poulenc) and 2.06 percent of a sodium $C_{20-24}$ alkyl toluene sulfonate as shown in Table 22. Salt ($Na_2SO_4$) was added to induce oil continuous microemulsions.

TABLE 21

| % NaATS | Norpar 13 | % PnB | % DPnB | % DPnP | isononyl alcohol | % $H_2O$ | % EDTA | % $Na_2SO_4$ | Cond. | Appearance | Visc. | Z | Structure |
|---|---|---|---|---|---|---|---|---|---|---|---|---|---|
| 2.06 | 10.67 | 3.76 | 3.35 | 0 | 0.77 | 79.14 | 0.077 | 0.125 | 610 | excess water | 9.5 | 1390 | w/o |
| 2.06 | 10.67 | 3.76 | 3.35 | 1.2 | 0.77 | 77.91 | 0.077 | 0.185 | 430 | excess water | 9.2 | 1470 | w/o |

TABLE 22

| % NaATS | % DM-9.0 | Norpar 13 | % PnB | % DPnB | % DPnP | isononyl alcohol | % $H_2O$ | % EDTA | % $Na_2SO_4$ | Cond. | Appearance | Visc. | Z | Structure |
|---|---|---|---|---|---|---|---|---|---|---|---|---|---|---|
| 2.06 | 0.26 | 10.67 | 3.76 | 3.35 | 0 | 0.51 | 79.18 | 0.077 | 0.19 | 81 | excess water | 25.7 | 1490 | w/o |
| 2.06 | 0.26 | 10.67 | 3.76 | 3.35 | 0.12 | 0.51 | 78.98 | 0.077 | 0.2 | 680 | excess water | 11.3 | 1530 | w/o |
| 2.06 | 0.26 | 10.67 | 3.76 | 3.35 | 0.12 | 0.51 | 78.96 | 0.077 | 0.22 | 258 | excess water | 8.7 | 1600 | w/o | sulfate and 69.4 percent water, which had a conductivity of 820 microSiemens/centimeter, a viscosity of 16 centistokes, a Z value of 1230.

EXAMPLE 17

Using the general method for preparing emulsions, several emulsions were prepared containing water, an organic solvent blend of Norpar™ 13 (a normal paraffinic oil with a distillation range of 225°–243° C. obtained from Exxon Chemical), PnB, dipropylene glycol monobutyl ether (DPnB), and dipropylene glycol monopropyl ether (DPnP), isononyl alcohol (Exxsolr™ 9 from Exxon Chemical Company) and a sodium $C_{20-24}$ toluene sulfonate and are shown in Table 21. Salt ($Na_2SO_4$) was added to induce oil continuous microemulsions.

Using the general method for preparing emulsions, several emulsions were prepared containing water, an organic solvent blend of Norpar™ 13 (a normal paraffinic oil with a distillation range of 225°–243° C. obtained from Exxon Chemical), PnB, dipropylene glycol monobutyl ether

EXAMPLE 19

Using the general method for preparing emulsions, several emulsions were prepared containing approximately 79 percent water, an organic solvent blend of Norpar™ 13 (a normal paraffinic oil with a distillation range of 225°–243° C. obtained from Exxon Chemical), PnB, dipropylene glycol monobutyl ether (DPnB), and dipropylene glycol monopropyl ether (DPnP), isononyl alcohol (Exxsol 9 from Exxon Chemical Company), a blend of nonionic surfactant (Tergitol™ 15-s-5 and Tergitol™ 15-s-3) and a sodium $C_{20-24}$ alkyl toluene sulfonate as shown in Table 23. Salt ($Na_2SO_4$) was added to the system to induce the system to invert to oil continuous structures. Each composition in Table 23 was oil continuous and contained 0.077 percent EDTA, 0.5 percent 2-isononyl alcohol and 0.26 percent of a 75/25 blend of Tergitol™ 15-s-5/15-s-3.

TABLE 23

| % NaATS | Nopar™ 13 | % PnB | % DPnP | % DPnP | % $H_2O$ | % $Na_2SO_4$ | Cond. | Appearance | Visc. | Z |
|---|---|---|---|---|---|---|---|---|---|---|
| 2.06 | 10.67 | 3.76 | 3.35 | 0 | 79.12 | 0.175 | 146 | excess water | 21.5 | 1340 |
| 2.06 | 10.67 | 3.76 | 3.35 | 0 | 79.11 | 0.185 | 38 | excess water | 27.3 | 1370 |
| 2.06 | 10.67 | 3.76 | 3.35 | 0.12 | 78.96 | 0.22 | 430 | excess water | 7.7 | 1600 |

What is claimed is:

1. A single phase oil continuous microemulsion useful as a liquid cleaning composition, comprising:

A. water in an amount greater than 40 percent by weight and less than 75 percent by weight based on the total weight of the microemulsion;

B. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives, and wherein the organic solvent or the mixture of two or more organic solvents are in an amount greater than 10 percent and less than 60 percent by weight based on the total weight of the microemulsion;

C. one or more ionic surfactants which are soluble in the one or more organic solvents, wherein the one or more ionic surfactants have an average molecular weight in the range from 350 to 700 exclusive of a counterion, and wherein the one or more ionic surfactants are present in a total amount greater than 0.1 percent and less than 10 percent by weight based on the total weight of the microemulsion;

the microemulsion characterized as being an oil continuous microemulsion having an electrical conductivity of less than Z (microSiemens/centimeter) when measured at 25° C. and a viscosity less than 20 centistokes as measured at 25° C., wherein Z is represented by the following formula: $Z=(1/3)(\Phi_w)^2\Sigma_i A_i m_i$, wherein $\Phi_w$ represents the volume fraction of water in the microemulsion, i represents any given electrolyte which is present in the microemulsion, $A_i$ represents the molar conductivity of electrolyte i and $m_i$ represents the molarity of electrolyte i in the aqueous phase.

2. The microemulsion of claim 1 wherein the one or more organic solvents is selected from the group consisting of an aliphatic alcohol, a dialiphatic ester, an aliphatic hydrocarbon, a chlorinated aliphatic hydrocarbon, an aromatic hydrocarbon, an aliphatic diester, an aliphatic ketone, an aliphatic ether, an alkylene glycol monoether, an alkylene glycol diether, an alkylene glycol ether acetate and combinations thereof.

3. The microemulsion of claims 1 or 2 wherein the one or more organic solvents is present in an amount greater than 30 weight percent and less than 50 weight percent.

4. The microemulsion of claim 1 wherein water is present in an amount greater than 45 weight percent and less than 70 weight percent.

5. The microemulsion of claim 1 wherein the ionic surfactant is a cationic surfactant having a molecular weight less than 600.

6. The microemulsion of claim 1 wherein the ionic surfactant is an anionic surfactant having an average molecular weight greater than 400 and less than 600.

7. The microemulsion of claim 6 wherein at least one anionic surfactant is formula $R_xB\text{—}SO_3M$ wherein R represents alkyl, x is 1 or 2, B is a biradical when x is 1 or is a triradical when x is 2 and which is derived from an aromatic moiety and wherein M represents hydrogen or a cationic counterion and wherein the total number of carbons in $R_x$ is from 18 to 30.

8. The microemulsion of claim 1 wherein the electrical conductivity is less than 0.5 Z (microSiemens/centimeter).

9. The microemulsion of claim 1 wherein viscosity is less than 10 centistokes.

10. The microemulsion of claim 1 wherein the electrical conductivity is less than 0.25 Z (microSiemens/centimeter).

11. The microemulsion of claim 1 wherein at least one organic solvent is an alkylene glycol monoether.

12. An emulsion, which upon standing at 25° C. forms at least two phases wherein one phase is an oil continuous microemulsion, comprising:

A. water in an amount greater than 60 percent by weight and less than 95 percent by weight based on the total weight of the emulsion;

B. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives, and wherein the organic solvent or the mixture of two or more organic solvents are in an amount greater than 4 percent and less than 40 percent by weight based on the total weight of the emulsion;

C. one or more ionic surfactants which are soluble in the one or more organic solvents, wherein the one or more ionic surfactants have a molecular weight in the range from 350 to 700 exclusive of a counterion, and wherein the one or more ionic surfactants are present in a total amount greater than 0.1 percent and less than 5 percent by weight based on the total weight of the emulsion;

the emulsion characterized as being an oil continuous emulsion, wherein the emulsion has an electrical conductivity of less than Z (microSiemens/centimeter) when measured at 25° C. and a viscosity less than 20 centistokes as measured at 25° C., wherein Z is represented by the following formula: $Z=(1/3)(\Phi_w)^2\Sigma_i A_i m_i$, wherein $\Phi_w$ represents the volume fraction of water in the microemulsion, i represents any given electrolyte which is present in the emulsion, $A_i$ represents the molar conductivity of electrolyte i and $m_i$ represents the molarity of electrolyte in the aqueous phase.

13. The emulsion of claim 12 wherein the one or more organic solvents is selected from the group consisting of an aliphatic alcohol, a dialiphatic ester, an aliphatic hydrocarbon, a chlorinated aliphatic hydrocarbon, an aromatic hydrocarbon, an aliphatic diester, an aliphatic ketone, an aliphatic ether, an alkylene glycol diether, an alkylene glycol diether, an alkylene glycol ether acetate and combinations thereof.

14. The emulsion of claims 12 or 13 wherein the one or more organic solvents is present in an amount greater than 8 weight percent and less than 25 weight percent.

15. The emulsion of claim 12 wherein water is present in an amount greater than 70 weight percent and less than 90 weight percent.

16. The emulsion of claim 12 wherein the ionic surfactant is a cationic surfactant having a molecular weight less than 600.

17. The emulsion of claim 12 wherein the ionic surfactant is an anionic surfactant having an average molecular weight greater than 400 and less than 600.

18. The emulsion of claim 17 wherein at least one anionic surfactant is of formula $R_xB\text{—}SO_3M$ wherein R represents alkyl, x is 1 or 2, B is a biradical when x is 1 or is a triradical when x is 2 and which is derived from an aromatic moiety and wherein M represents hydrogen or a cationic counterion and wherein the total number of carbons in $R_x$ is from 18 to 30.

19. The emulsion of claim 12 wherein the electrical conductivity is less than 0.5 Z (microSiemens/centimeter).

20. The emulsion of claim 12 wherein viscosity is less than 10 centistokes.

21. The emulsion of claim 12 wherein the electrical conductivity is less than 0.25 Z (microSiemens/centimeter).

22. The emulsion of claim 12 wherein at least organic solvent is an alkylene glycol monoether.

23. The emulsion of claim 12 wherein water is in an amount greater than 80 weight percent and less than 90 weight percent.

24. A cleaning concentrate, which comprises:

A. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives; and B. one or more ionic surfactants which are soluble in the one or more organic solvents, wherein the one or more ionic surfactants have a molecular weight in the range from 350 to 700 exclusive of a counterion, wherein said cleaning concentrate may be diluted with water to form a microemulsion comprising:

C. water in an amount greater than 40 percent by weight and less than 75 percent by weight based on the total weight of the microemulsion;

D. an organic solvent or a mixture of two or more organic solvents, wherein the organic solvent or mixture of organic solvents are characterized as containing no more than 2 weight percent water at 25° C. when the organic solvent is saturated with water in the absence of surfactants or other additives, and wherein the organic solvent or the mixture of two or more organic solvents are in an amount greater than 10 percent and less than 60 percent by weight based on the total weight of the microemulsion;

E. one or more ionic surfactants which are soluble in the one or more organic solvents, wherein the one or more ionic surfactants have an average molecular weight in the range from 350 to 700 exclusive of a counterion, and wherein the one or more ionic surfactants are present in a total amount greater than 0.1 percent and less than 10 percent by weight based on the total weight of the microemulsion;

the microemulsion characterized as being an oil continuous microemulsion having an electrical conductivity of less than Z (microSiemens/centimeter) when measured at 25° C. and a viscosity less than 20 centistokes when measured at 25° C., wherein Z is represented by the following formula: $Z=(1/3)(\Phi_w)^2 \Sigma_i A_i m_i$, wherein $\Phi_w$ represents the volume fraction of water in the microemulsion, i represents a given electrolyte, $A_i$ represents the molar conductivity of electrolyte i and $m_i$ represents the molarity of electrolyte i in the aqueous phase.

25. A method for cleaning metal having grease or oily soil on a surface of the metal which comprises applying the composition of any of claims 1, 2, 4–13, or 15–23 to the metal which has grease or oily soil on the surface of the metal to remove at least a portion of the grease or oily soil from the metal.

* * * * *

UNITED STATES PATENT AND TRADEMARK OFFICE
CERTIFICATE OF CORRECTION

PATENT NO. : 5,597,792

DATED : January 28, 1997

INVENTOR(S) : John Klier, Gary M. Strandburg, Christopher J. Tucker

It is certified that error appears in the above-identified patent and that said Letters Patent is hereby corrected as shown below:

Col. 26, line 33, (Claim 13) "diether" (where it first appears) should read --monoether--.

Signed and Sealed this

Eighteenth Day of July, 2000

Attest:

Q. TODD DICKINSON

*Attesting Officer*  *Director of Patents and Trademarks*